United States Patent
Feiweier et al.

(10) Patent No.: US 7,038,453 B2
(45) Date of Patent: May 2, 2006

(54) METHOD AND MAGNETIC RESONANCE TOMOGRAPHY APPARATUS FOR SPATIALLY RESOLVED MEASUREMENT OF THE $B_1$ FIELD DISTRIBUTION

(75) Inventors: Thorsten Feiweier, Poxdorf (DE); Peter Heubes, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/921,606

(22) Filed: Aug. 19, 2004

(65) Prior Publication Data

US 2005/0073304 A1   Apr. 7, 2005

(30) Foreign Application Priority Data

Aug. 19, 2003   (DE) ................................ 103 38 075

(51) Int. Cl.
*G01V 3/00*   (2006.01)
(52) U.S. Cl. ........................ 324/314; 324/309
(58) Field of Classification Search ............... 324/314, 324/307, 309, 306, 300
See application file for complete search history.

(56) References Cited

U.S. PATENT DOCUMENTS

| 5,001,428 A | * | 3/1991 | Maier et al. ................. 324/309 |
| 5,416,412 A | * | 5/1995 | Slayman et al. ............. 324/314 |
| 5,914,599 A | * | 6/1999 | Sharp .......................... 324/318 |
| 6,268,728 B1 | * | 7/2001 | Morrell ....................... 324/307 |
| 6,289,232 B1 | * | 9/2001 | Jakob et al. ................. 600/410 |

* cited by examiner

*Primary Examiner*—Louis Arana
(74) *Attorney, Agent, or Firm*—Schiff Hardin LLP

(57) ABSTRACT

In a method and magnetic resonance tomography apparatus for spatially resolved measurement of the magnetic high frequency field distribution in the apparatus, a double echo high frequency pulse sequence with a first excitation pulse following by at least two refocusing pulses are emitted for generation of a first echo and a following second echo. At least the excitation pulse is slice selective. In an excitation layer defined by the slice selective excitation pulse a first echo image and second echo image are spatially resolved by using suitable gradient pulses for phase or frequency encoding Using the relationships of the amplitudes of the first and second echo image in the various locations the flip angles representing the field strength at the relevant locations in the relevant slice are determined.

13 Claims, 10 Drawing Sheets

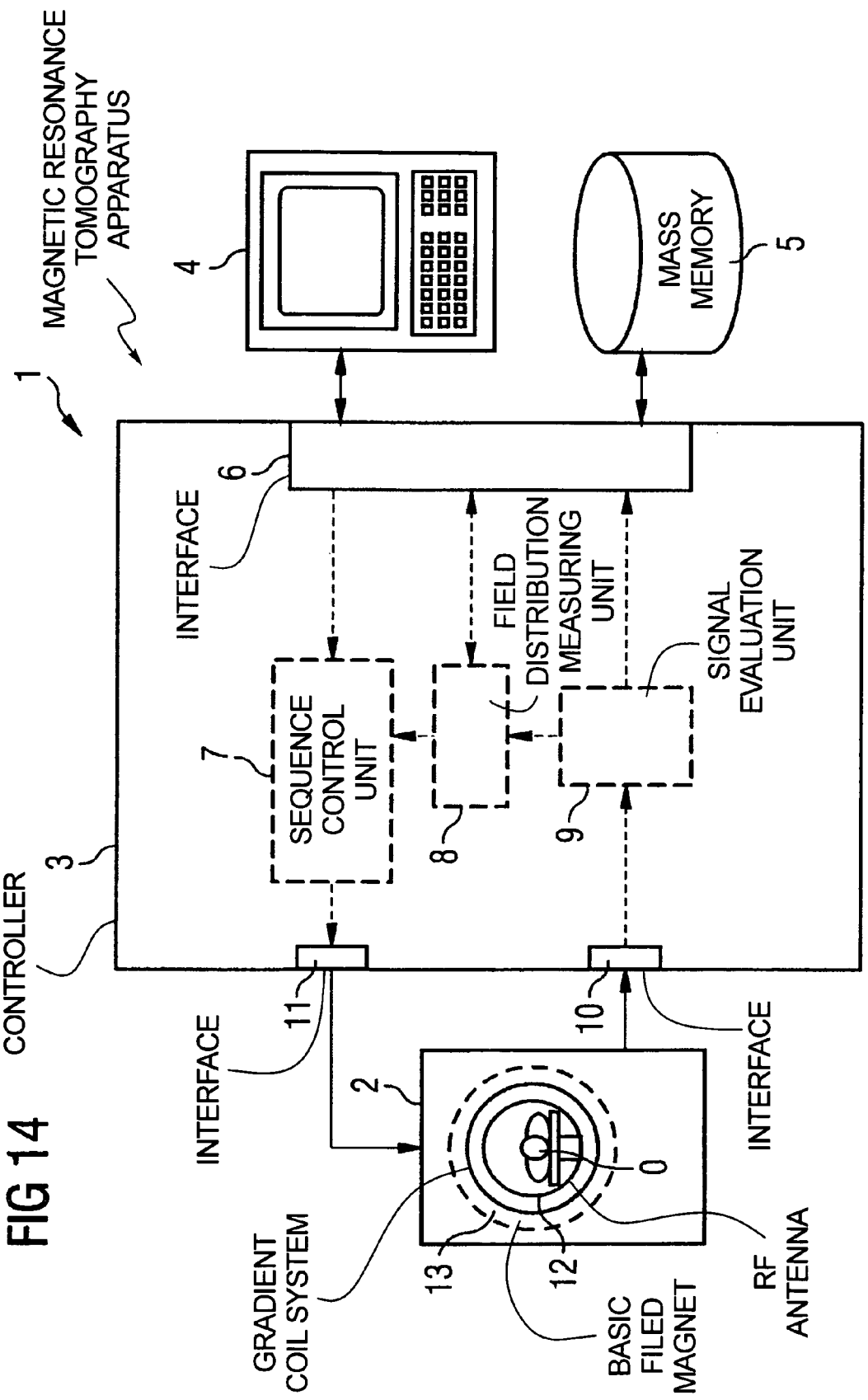

METHOD AND MAGNETIC RESONANCE TOMOGRAPHY APPARATUS FOR SPATIALLY RESOLVED MEASUREMENT OF THE $B_1$ FIELD DISTRIBUTION

BACKGROUND OF THE INVENTION

1. Field of the Invention

The present invention relates to a method for spatially resolved measurement of the field distribution of high frequency pulses emitted from a high frequency antenna of a magnetic resonance scanning. In addition the invention relates to a magnetic resonance apparatus with a high frequency antenna and components for spatially resolved measurement of the field distribution of emitted high frequency pulses.

2. Description of the Prior Art

Magnetic resonance imaging, also called magnetic resonance tomography, is a technique that is now widespread for acquiring images of the body interior of a living object to be examined. In order to acquire an image with this method, the body or the body part to be examined must first be exposed to a homogenous static basic magnetic field (usually characterized as a $B_0$ field), which is generated by a basic field magnet of the magnetic resonance measuring instrument (scanner). During the data acquisition for the magnetic resonance images, rapidly switched gradient fields for local coding are superimposed on this basic magnetic field, these fields being generated by gradient coils. Moreover, with high frequency antennae, high frequency pulses of a defined field strength are irradiated in the object to be examined. The magnetic flux density of these high frequency pulses is usually termed as $B_1$. The pulse-shaped high frequency field is therefore generally also called the $B_1$ field for short. By means of these high frequency pulses the nuclear spins of the atoms in the object to be examined are excited in such a way that they are deflected by a so-called "excitation flip angle" (in the following also referred to as "flip angle") from their state of equilibrium parallel to the base magnetic field $B_0$. The nuclear spins then precess in the direction of the basic magnetic field $B_0$. The magnetic resonance signals generated as a result are picked up by high frequency receiving antennae. The receiving antennae can either be the same antennae with which the high frequency pulses are irradiated, or separate receiving antennae can be used. The magnetic resonance images of the object to be examined are finally created on the basis of the received magnetic resonance signals. Each pixel in the magnetic resonance image is assigned to a small body volume, a so-called "voxel", and every brightness or intensity value of the pixels is linked with the signal amplitude of the magnetic resonance signal received from this voxel. The relationship between a resonant irradiated high frequency pulse with the field strength $B_1$ and the flip angle a achieved with it is given by the equation $$\alpha = \int_{t=0}^{\tau} \gamma \cdot B_1(t) \cdot dt \tag{1}$$

wherein $\gamma$ is the gyromagnetic relationship, which for most magnetic resonance examinations is a fixed matter constant, and $\tau$ is the exposure time of the high frequency pulse. The flip angle achieved by means of an emitted high frequency pulse and hence the strength of the magnetic resonance signal consequently not only depends on duration of the pulse, but also depends on the strength of the irradiated $B_1$ field. Spatial fluctuations in the field strength of the exciting $B_1$ field therefore result in undesired variations in the received magnetic resonance signal, which can falsify the results of the reading.

Inconveniently, however the high frequency pulses, particularly in the case of high magnetic field strengths—which due to the required magnetic base field $B_0$ are necessarily present in magnetic resonance tomography—show an inhomogeneous penetration behavior in conductive and dielectric media such as tissue, for example. As a result of this, the $B_1$ field can vary greatly within the measuring volume. To be able to take these variations of the $B_1$ field into consideration in the measurement for example in an adjustment of the $B_1$ field or in an evaluation of the received magnetic resonance signals, it would be very advantageous if this effect could be quantified.

Currently, for calibration of the high frequency pulse voltage and the average $B_1$ amplitude or the average target flip angle which is to be achieved by the HF pulse, conventionally a so-called "transmitter adjustment" is automatically performed within an adjustment sequence of the magnetic resonance measuring apparatus. For this purpose, a first high frequency excitation pulse is first emitted within a so-called double echo high frequency pulse sequence, which deflects the nuclear spins by a flip angle $\alpha_1$. Then after a specified time a second pulse takes place, a so-called "refocusing pulse", which results in a further flipping by $2\cdot\alpha_1$.

After measurement of a first echo (so-called spin echo) an additional $\alpha_1$ refocusing pulse is emitted and a second echo (the so-called stimulated echo) is measured. The following applies for the amplitude of the measured spin echo signal $A_{SE}$ and the measured stimulated echo signal $A_{STE}$ as a function of the flip angle $\alpha_1$ $$A_{SE}=e^{i\phi}\sin^3(\alpha_1) \tag{2a}$$

$$A_{STE}=e^{i\phi}\sin^3(\alpha_1)\cos(\alpha_1) \tag{2b}$$

This dependency is graphically represented in FIG. 2. The flip angle $a_1$ achieved with such a pulse sequence can hence be determined by the condition $$\cos\alpha_1 = \frac{A_{STE}}{A_{SE}} \tag{3}$$

from the relationship of the amplitude of the two echo signals. This flip angle $a_1$ can be converted into the irradiated $B_1$ field with the help of equation (1).

However, in this classic transmitter adjustment it must be noted that the magnetic resonance signal stems from the whole excitation volume and not just the relevant part near the isocenter of the magnet, i.e. of the central area in the MR device. Due to the finite bandwidth of the high frequency pulse, moreover, a flip angle distribution over the excited volume must be assumed. For this reason in practice, as a rule a weak, constant slice selection gradient is switched. As a result the high frequency pulses are slice selective and instead of the entire excitation volume, only a central transversal layer with a thickness of for example 10 cm is excited. This constant slice gradient is also created during the data collection. As a result the possibility of spatial resolution exists along the slice standards, i.e. along the thus defined z-axis parallel to the $B_0$ field. In practice the collected echo signals are Fourier transformed and only the central column of the transformed signals is evaluated. This central column contains the signal contributions of an approximately 1 mm thick slice section, within which a restricted pulse bandwidth does not play a significant role.

In addition, due to the fact that the excited nuclear spins gradually tilt back (relax) parallel to the basic magnetic field, in particular the so-called $T_1$ relaxation (longitudinal relaxation) influences the two echoes in variable form. As a result the results are falsified. Through the $T_1$ relaxation, which is tissue-dependent, the measurable amplitude $$e^{\frac{-t}{T_1}}$$

of the stimulated echo $A_{STE}$ is lower by the factor of e than without a relaxation effect. In reality this correctly results in the following for the relationship of the amplitudes $$\frac{A_{STE}}{A_{SE}} = \cos(\alpha)e^{\frac{-t}{T_1}} \quad (4)$$

wherein t is the duration between the $2^{nd}$ and the $3^{rd}$ high frequency pulse. If one evaluated the flip angle unchanged according to equation (3), values would be measured that are systematically too large for flip angle <90° and values that are systematically too low for flip angle >90°. In practice therefore the amplitude of the stimulated echo under the assumption of a "mean" $T_1$ value would be corrected up by approximately 5%. Moreover, the method is applied iteratively until a flip angle of α that is approximately equal to 90° is found. That is, a first measured mean flip angle $\alpha_1$ is used as an approximate value for the actual flip angle, which due to the influence of the $T_1$ relaxation is not precisely measurable. A high frequency pulse voltage is then estimated from the first measured flip angle $\alpha_1$, said high frequency pulse voltage being necessary to obtain a specified flip angle $\alpha_2$=90°. The whole measurement is then repeated with the target flip angle $\alpha_2$. This procedure is iterated until finally a flip angle a of approximately 90° is achieved. The influence of the $T_1$ relaxation is then minimal and precisely the high frequency pulse voltage U is determined, which is necessary to generate a flip angle of 90° with the used high frequency pulse shape and duration.

Since the transmitter adjustment is performed only for the central, average layer, this procedure however can only guarantee that a correct average target flip angle is set in a measurement. Space-dependent variations of the $B_1$ field within the measuring volume of interest cannot be taken into consideration. The adjustment method hence still is acceptable with the currently most widespread field strengths of the base magnet field of up to 1.5 tesla, since here the $B_1$ field is relatively homogeneous. In the case of field strengths of 3 tesla, however, as used in newer intense field devices, a more precisely spatially resolved specification of the $B_1$ field is needed.

SUMMARY OF THE INVENTION

An object of the present invention is to provide an alternative to the aforementioned state of the art, which makes possible a high-speed spatially resolved measurement of the $B_1$ field distribution or the flip angle distribution.

This object is achieved by a method, in accordance with the invention wherein the high frequency antenna is used to emit a double echo high frequency pulse sequence with a first excitation pulse and at least two refocusing pulses following thereafter for generation of a first echo (e.g. a spin echo) and a following second echo (e.g. a stimulated echo). In the process at least the excitation pulse is emitted slice selectively. A slice selective excitation is achieved by having the excitation pulse emitted with a specified form, preferably in the form of a sinc function, and with an appropriate frequency and at the same time emitting an appropriate gradient pulse, so that the excitation pulse excites only the spins in the desired defined layer. Then in an excitation layer defined by the slice selective excitation pulse, a first two-dimensional echo image and second two-dimensional echo image undergo spatially resolved measurement by means of the emission of suitable gradient pulses for phase or frequency coding. Such a "spatially resolved" measurement of the echo images is possible with a method in which first the two echoes are measured by means of scanning the time history with m data points several times with n different amplitudes of the phase coding gradients. The result of this measurement is then a data matrix with m columns and n rows for each of the echoes, i.e. of the spin and stimulated echoes in the so-called "time domain" (also called "k-space"). This matrix is two-dimensionally Fourier transformed separately for each echo. One obtains from this a genuine two dimensional image for each echo with k·1 pixels, whereby in general m=n=k=1 is set. Using the relationship of the amplitudes of the first and second echo image in the various locations, i.e. for each individual image pixel, the local flip angle is measured at the relevant locations. By means of such a measurement a locally resolved measurement of the flip angle is consequently possible within the layer, i.e. a flip angle distribution is measured.

The flip angle measured at a specified location is representative of the $B_1$ field irradiated at the relevant location, whereby the dependency is given through equation (1). That is, with the help of this equation (if the pulse used is known) it is possible to convert from a flip angle distribution to a $B_1$ field distribution and vice versa at will. The terms "flip angle distribution" and "$B_1$ field distribution" or "high frequency field distribution" are thus as a rule used synonymously herein. Accordingly a determination of a $B_1$ field distribution is to be equated with a determination of the corresponding flip angle distribution herein.

With the method of the invention it is hence possible to specify in vivo a precise distribution of the magnetic high frequency field. This fundamentally also permits a corresponding in vivo adjustment of the $B_1$ field distribution of high frequency pulses during an examination.

With such a method of the invention for adjusting the field strength of high frequency pulses, which are emitted in a magnetic resonance reading from an antenna of the magnetic resonance measuring instrument, the field strength in a specified volume range of an examination object is optimized, whereby during the optimization the current $B_1$ field distribution in the specified volume range is determined according to the measuring method of the invention. Preferably in a first determining the $B_1$ field distribution is determined or the flip angle distribution in the specified volume range using the method of the invention and then in a second procedural step on the basis of the measured field distribution determining a high frequency pulse excitation profile is determined, in which the high frequency distribution exhibits a specified form. Then excitation takes place in a subsequent measurement according to the determined high frequency pulse excitation profile. Such a high frequency pulse excitation profile that has been calculated beforehand can be precisely set by irradiating as an excitation pulse a relatively complex, excitation pulse calculated specially on the basis of the previously measured high frequency distribution while simultaneously irradiating an appropriate gradient pulse calculated for this case that is also quite complex. Such a possibility for irradiating a defined spatial excitation profile is e.g. described in an article by Sersa et al. in the Journal of Magnetic Resonance 135; 466 to 477 (1998).

A magnetic resonance measuring apparatus according to the invention must in particular exhibit a field distribution measuring instrument, which for the purpose of spatially resolved measurement of the magnetic high frequency distribution causes the emission of a corresponding double echo high frequency pulse sequence with a first excitation pulse and at least two refocusing pulses following it for the generation of a first echo and a subsequent second echo via the high frequency antenna. The field distribution measuring instrument must ensure that at least the excitation pulse is slice selectively emitted and that then in an excitation layer defined by means of the slice selective excitation pulse with the activation of suitable gradient pulses for phase coding and/or frequency coding a first echo image and a second echo image are subjected to locally resolved measurement. The field distribution measuring instrument must additionally have a unit to determine the flip angle at the relevant location using the relationship of the amplitudes of the first and second echo images at differing locations.

The field distribution measuring instrument preferably is integrated into the conventional controller that is used for controlling the magnetic resonance measuring apparatus. The field distribution measuring instrument also can be constructed in several parts, i.e. of different modules, which for example are integrated in the different components of the controller. Preferably the implementation takes place in the form of a software module, which as a $B_1$ or flip angle distribution measuring program can be called within a computer-aided controller of the magnetic resonance measuring apparatus. Computer-aided controller means a controller, which is equipped with a suitable processor as well as further components for executing the provided control programs.

In principle all high frequency pulses of the double echo high frequency pulse sequence, i.e. both the excitation pulse as well as the subsequent refocusing pulses can be layer selectively emitted. However, it must be remembered that due to the specially required pulse shape and the simultaneously emitted layer selection gradients a slice selective pulse always generates an excitation distribution, i.e. a flip angle distribution along the layer standards. This flip angle distribution generated by means of the slice selective pulse is superimposed on the flip angle distribution to be measured, which is generated by the inhomogeneous $B_1$ field. This can lead to systematically falsified results in the determination of the penetration behavior of the $B_1$ field, which is distorted simply by the electrical properties of the object to be examined.

Therefore in a preferred variant of the method only the excitation pulse is layer selectively emitted within the double echo high frequency pulse sequence. The refocusing pulses, on the contrary, are not layer selectively emitted. For the amplitudes of the first echo and second echo the following applies, similar to equations (2a) and (2b)

$$A_{SE}=e^{i\phi} \sin(\beta)\sin^2(\alpha) \tag{5a}$$

$$A_{STE}=e^{i\phi} \sin(\beta)\sin^2(\alpha)\cos(\alpha) \tag{5b}$$

wherein $\beta$ is the target flip angle generated by the excitation pulse and $\alpha$ represents the flip angle achieved by the non-layer selective refocusing pulse, i.e. a high frequency pulse sequence of the form $\beta$–$2\alpha$–Echo1–$\alpha$–Echo 2 would be employed. The excitation pulse and the refocusing pulses can also be selected in such a way that the flip angles $\beta$ and a have the same value. However, as a rule this is not necessarily the case. The different terms $\beta$ and a were selected above all to represent the fact that the one pulse is a layer selectively emitted pulse and the additional pulses are non-selective pulses.

Under the prerequisite that only the flip angle $\beta$ varies on account of the layer selectively emitted excitation pulse along the layer standards, i.e. in z-direction, the following results $$A_{SE}=\int dz e^{i\phi} \sin(\beta(z))\sin^2(\alpha)=e^{i\phi} \sin^2(\alpha)c \tag{6a}$$

$$A_{STE}=\int dz e^{i\phi} \sin(\alpha(z))\sin^2(\alpha)=e^{i\phi} \sin^2(\alpha)\cos(\alpha)c \tag{6b}$$

with the constant factor $c=\int dz \sin(\beta(z))$.

Therefore, Equation (3) still applies for the relationship of the two amplitudes. Consequently, it is also possible with this pulse sequence of the flip angle a to slice selectively determine the relationship of the amplitude of the stimulated echo to the amplitude of the spin echo—i.e. in a slice defined by the excitation pulse, without having the result falsified by a flip angle distribution generated by the high frequency pulses along the slice standards.

To accelerate the measurement of a larger volume consisting of several thin slices, preferably a multilayer measurement is performed. In the process within the double echo high frequency pulse sequence several excitation pulses are first slice selectively emitted in succession, by means of which spins are excited in various slices. Following the excitation pulses, the nonslice selective refocusing pulses for generating the first echoes and second echoes in the various slices are emitted for all the slices. In this way, in spite of the use of non-selective high frequency pulses within the repetition time it is possible to measure signals from several layers parallel to and independent of one another. Otherwise after collecting the signals of a layer it would be necessary to wait out the entire repetition time, which would involve a considerably higher overall measuring time.

To reduce the influence of the $T_1$ relaxation time on the data, as with the conventional transmitter adjustment, an average $T_1$ value can be assumed and the amplitude of the stimulated echo signal can be corrected with a corresponding correction factor, before the flip angle a is determined from the amplitude of the stimulated echo and the spin echo. Corresponding correction values are known from the literature, whereby as a rule one can assume that the relaxation time $T_1$ is between 300 ms and 500 ms. Since the $T_1$ relaxation is tissue-dependent, the correction factor can preferably also be selected as a function of a material type of an examined object located at the relevant location. For example first the tissue type is determined, and then an appropriate correction factor is selected.

In an alternative, preferred technique a flip angle distribution is subjected to spatially resolved measurement several times to reduce the relaxation influence for the same slice. In the process the pulse sequences used are each prescribed different target flip angles. The measured flip angle distributions or field distributions in the relevant slice are then combined pixel-by-pixel.

In the process it is basically sufficient if in the measurements only those rows lying in the central region of the Fourier domain (also called k-space) are collected several times and the remaining rows lying outside are only collected once for all measurements of the relevant layer. It should be noted that—even if only the rows lying in the central region of the Fourier domain are collected—nevertheless in each measurement the entire slice in the spatial domain is taken into consideration. This approach makes use of the fact that in the average range of k-space the smaller local frequencies are represented, i.e. places that encode the information about large-area, relatively homogeneous ranges in the local space. In contrast, particularly edges with strong intensity changes are represented by moans of Fourier transformation in the outer k-space rows. By measuring only the rows lying in the central region of k-space several times consequently above all those regions which are large-surface and relatively homogeneous are measured several times. Proceeding from a generally slowly varying spatial distribution of the transmitted $B_1$ field the collection of this information suffices for determining a $B_1$ card, which considerably reduces the required measuring time.

There are various possibilities for a combination of the flip angle distribution or field distribution collected in the various measurements of the same layer.

In a preferred alternative, the specific flip angle exhibiting the slightest difference to a 90° flip angle is selected from among the flip angles measured in various measurements on the relevant location, since the $T_1$ influence is the slightest for a flip angle near 90°. Additionally, whether at least one of the measured signals for determining the relevant flip angle at this location exhibits a sufficiently high intensity is taken into consideration. Preferably, in the process attention is paid to the amplitude of the spin echo, since this echo is stronger in any case. In principle, however, the amplitude of the stimulated echo or a sum of the amplitudes etc. can also be taken into consideration. In this case the selected flip angle is used in standardized form for the relevant pixel in the corrected flip angle distribution. The standardization takes place on the basis of the relationship of the set target flip angle in the associated measurement (in the following referred to as the measurement flip angle) to a specified prescribed target flip angle. It is advisable to select a target flip angle of 90° for this.

Alternatively, in the combination of the measured flip angle distributions a mean value weighted to a 90° flip angle can be formed pixel by pixel from the measured flip angles in the different measurements preferably with the intensity and/or the difference of the measured flip angle. The flip angle standardized to a selected target flip angle can be used practically in this formation of a average value.

DESCRIPTION OF THE DRAWINGS

FIG. 14 is a block diagram of a magnetic resonance tomography apparatus of the invention.

DESCRIPTION OF THE PREFERRED EMBODIMENTS

Figure 1:
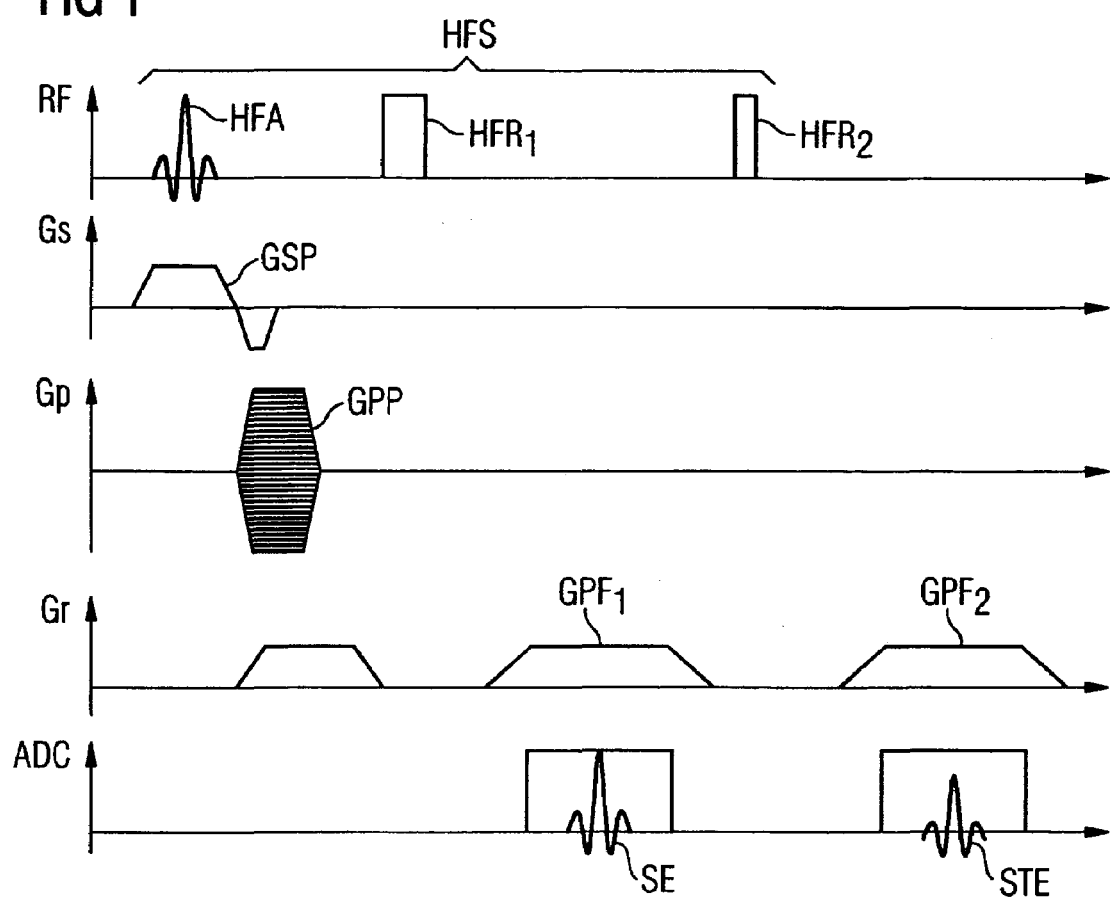
FIG. 1 is a pulse diagram for spatially resolved data acquisition of a single slice.

In the pulse sequence diagram shown in FIG. 1 the pulses emitted by the high frequency transmitting antenna and the various gradients switched appropriately in chronological dependency on the high frequency pulses are shown in conventional manner on parallel time axes.

The high frequency pulses emitted by the high frequency transmitter antenna are represented by the upper axis labeled with RF (radio-frequency). The Gs gradient represented below is the slice selection gradient, which is in the z-direction and effects a selection of a specified slice in which spins are excited. The phase encoding gradient Gp, which provides for phase encoding, is also shown. This phase encoding gradient is switched to different values very quickly during a measurement. The third gradient Gr is the read-out gradient or frequency-encoding gradient, which is activated to read out frequency encoded signals in a specified layer. In total, by appropriate switching of the phase encoding gradient Gp and the read-out gradient Gr a spatially resolved measurement of signals within the slice specified by the slice selection gradient Gs can take place. The precise sequence of the phase encoding and frequency encoding to the spatially resolved measurement within a slice as well as the representation in such a sequence diagram are known to those skilled in the art and need not be further explained here. On the lowest time axis the actual signal supplied to the ADC (analog digital converter) is represented.

As the high frequency pulse sequence diagram represented in FIG. 1 shows, for spatially resolved data acquisition a first excitation pulse HFA is first slice selectively emitted via the high frequency antenna of the magnetic resonance device, causing the spins to be flipped by a flip angle β in a precisely defined layer, e.g. vertical to the field direction of the B0 field (z-direction). The slice selection is achieved by emitting a gradient pulse GSP acting in z-direction parallel to the emitting of the high frequency pulse HFA and selecting the frequency and the form of the excitation pulse HFA in suitable fashion. Preferably a sinc function is used, as shown.

The second pulse within the double echo high frequency pulse sequence HFS, which is emitted via the high frequency antenna, is a refocusing pulse $HFR_1$, whose amplitude and duration are selected such that a flip angle of 2α is achieved. Then after a defined time period the emission of an additional refocusing pulse HFR$_2$ takes place, which has an amplitude and duration so that a flip angle α is achieved.

As the diagram shows, the refocusing pulses HFR$_1$ and HFR$_2$—in contrast to the excitation pulse HFA—are simple rectangular pulses. A parallel switching of the slice selection gradient Gs does not occur, so that the refocusing pulses HFR$_1$ and HFR$_2$ are non-slice selective. In the slice selection gradient Gs, the positive portion of the first slice selection gradient pulse GsP is followed by a short negative portion, in order to reset the unwanted dephasing of the magnetization which was unavoidably generated by the positive portion of the slice selection gradient pulse GsP.

The phase encoding gradient is activated between the excitation pulse HFA and the first rephrasing pulse HFR$_1$, whereby the gradient pulse is repeated in the case of successive repetitions of the pulse sequence with different amplitudes. This is represented by the multiple superimposed pulses on a single pulse GPP.

After the first refocusing impulse HFR$_1$ a first frequency encoding gradient pulse GPF$_1$ is activated, in order to generate the first echo, the spin echo signal SE. A second frequency encoded gradient pulse GPF$_2$ then takes place after the second refocusing pulse HFR$_2$, in order to generate the second echo, the stimulated echo signal STE. The gradient pulse preceding the two frequency encoded gradient pulses GPF$_1$, GPF$_2$, a portion of which is activated with the phase encoded gradient pulse GPP, only serves the purpose of dephasing in advance the spins in the direction of the read gradient Gr and thus achieving a refocusing of the echoes during the read out time in the presence of the frequency encoding gradient pulses GPF$_1$, GPF$_2$. This pulse generally is only half as long as the actual frequency encoded gradient pulses GPF$_1$ and GPF$_2$.

Figure 2:
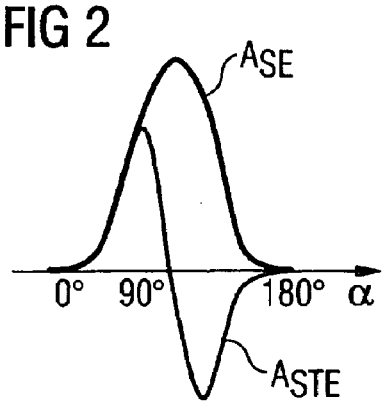
FIG. 2 shows the amplitude of a spin echo signal and an associated stimulated echo signal as a function of the flip angle.

As can be seen from FIG. 1, the amplitude of the stimulated echo signal STE is smaller than that of the spin echo signal SE. FIG. 2 shows the amplitudes $A_{STE}$ and $A_{SE}$ as a function of the flip angle a. The function shown in FIG. 2 is valid for a high frequency pulse sequence in which the value of the flip angle β of the excitation pulse HFA matches the flip angle a of the refocusing pulses HFR$_1$, HFR$_2$.

As already mentioned, on the basis of this flip angle dependency it is possible to determine from the relationship of the echo amplitudes $A_{SE}$, $A_{STE}$ the flip angle a according to the Equations (5a), (5b), (6a), (6b) and (3).

With the pulse sequence according to FIG. 1 and the corresponding evaluation of the amplitude relationships it is thus possible to determine relatively easily the flip angle a and hence the distribution of the B$_1$ field in a single slice.

Figure 3:
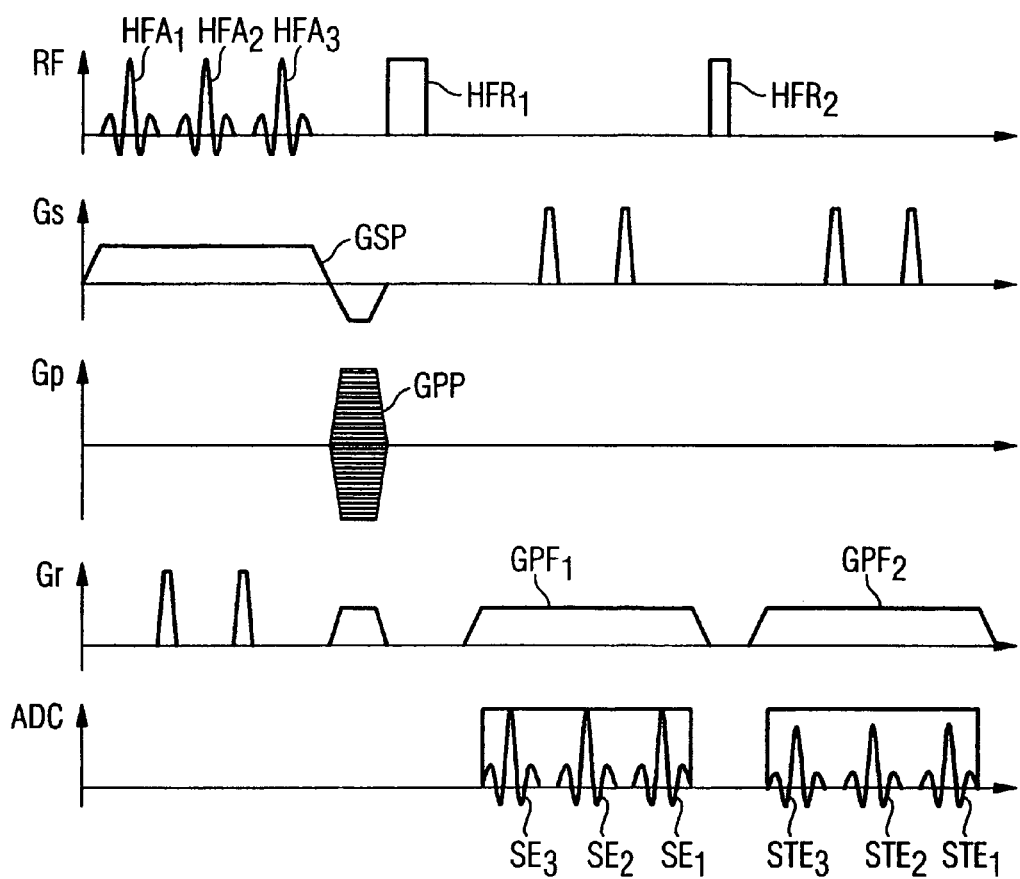
FIG. 3 is a pulse diagram of the parallel spatially resolved data acquisition of several slices.

The sequence can be repeated for every individual slice. To reduce the time period for the measurement of a greater volume, several high frequency excitation pulses can first be emitted in succession by switching a corresponding slice selective gradient Gs. Such a "multi slice procedure" is schematically represented in FIG. 3 for the simultaneous measurement of three layers. Here three excitation pulses HFA$_1$, HFA$_2$, HFA$_3$ are emitted first via the high frequency transmission antenna, while parallel to this via the emission of all three high frequency excitation pulses HFA$_1$, HFA$_2$, HFA$_3$ a slice selective gradient pulse GSP is emitted.

Immediately after the slice selective gradient pulse GSP the emission of the phase encoding gradient pulse GPP takes place, as with the measuring sequence in accordance with FIG. 1. Then the high frequency transmission antenna emits a first non-slice selective high frequency refocusing pulse HFR$_1$.

Activation of a first frequency encoded gradient pulse GPF$_1$ then occurs. While this gradient pulse GPF$_1$ is being emitted, the spin echo signals SE$_3$, SE$_2$, SE$_1$ originating from the different slices can be measured on the ADC. The first spin echo signal SE$_3$ comes from the layer that was last excited. Finally the spin echo signal SE$_1$ is picked up from the slice which was first excited by the first high frequency excitation pulse HFA$_1$.

A second high frequency refocusing pulse HFR$_2$ then is again emitted and a second frequency encoded gradient pulse GPF$_2$ is switched in order to measure the signals STE$_3$, STE$_2$, STE$_1$ of the stimulated echoes.

The gradient pulses not shown in FIG. 3 in the slice selective gradient Gs and in the frequency encoding gradient Gr serve the purpose of eliminating rephrasing or dephasing effects.

The pulse diagram according to FIG. 3 also can be extended to simultaneous data acquisition fro more than three layers.

As already mentioned, the longitudinal relaxation time T$_1$ influences in particular the magnitude of the amplitude $A_{STE}$ of the stimulated echo signal STE. This can result in a systematic measuring error. To minimize as far as possible this influence of the relaxation time T$_1$, a series of measurements with different target flip angles (measuring flip angles) is performed. From the individual flip angle distributions or field distributions (in the following also called B$_1$ cards) measured in the process, a common B$_1$ map that is as independent as possible from the relaxation time is generated for each layer to be measured.

Figure 4:
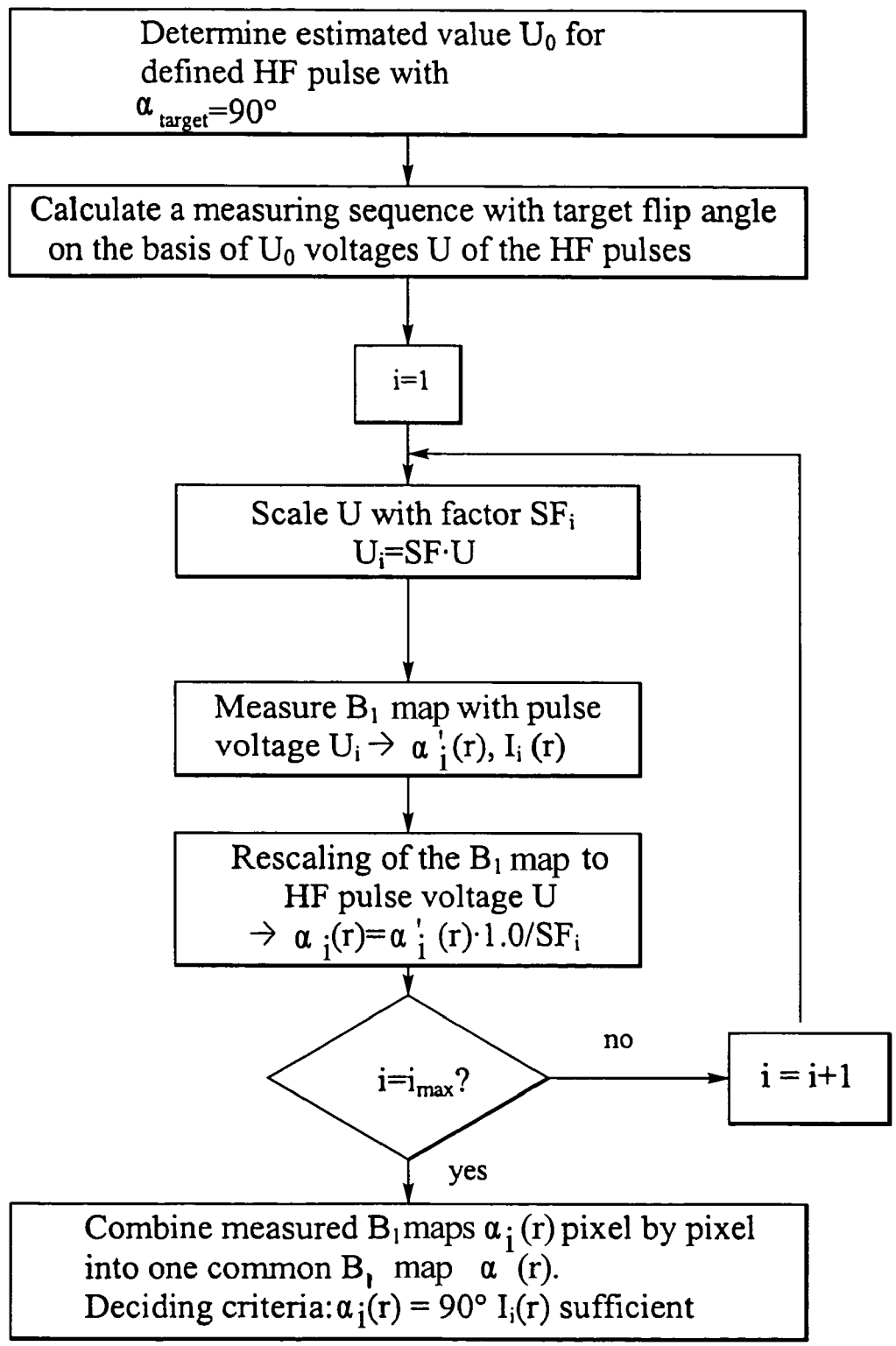
FIG. 4 is a flow for the sequence of a correction procedure for compensation of the $T_1$ relaxation influence.
Figure 5:
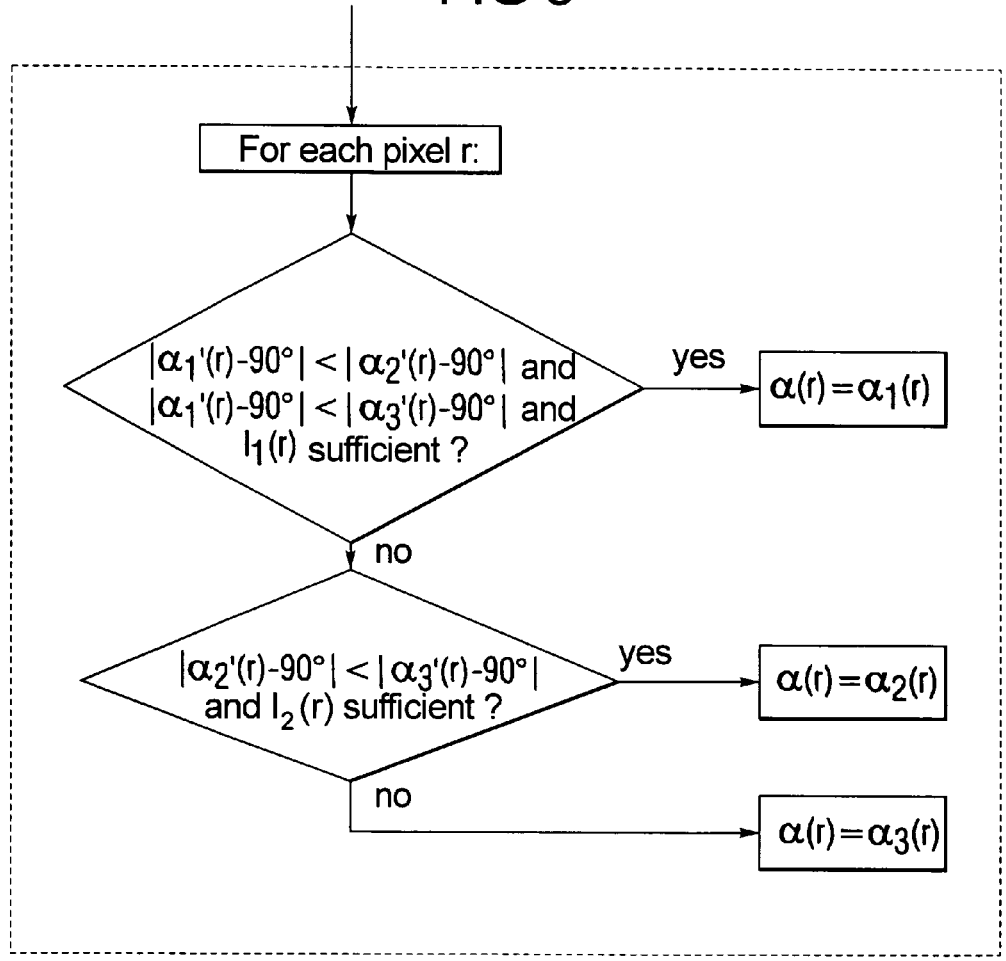
FIG. 5 is a detailed flowchart for a first variant of the last step in FIG. 4.
Figure 6:
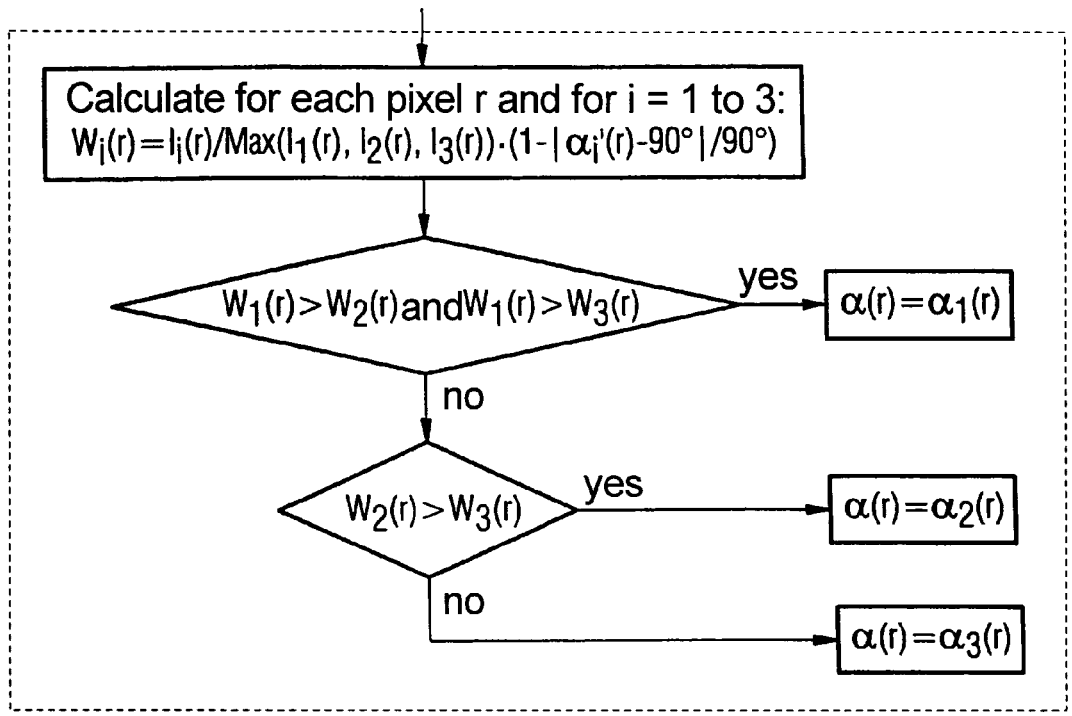
FIG. 6 is a detailed flowchart for a second variant of the last step in FIG. 4.
Figure 7:
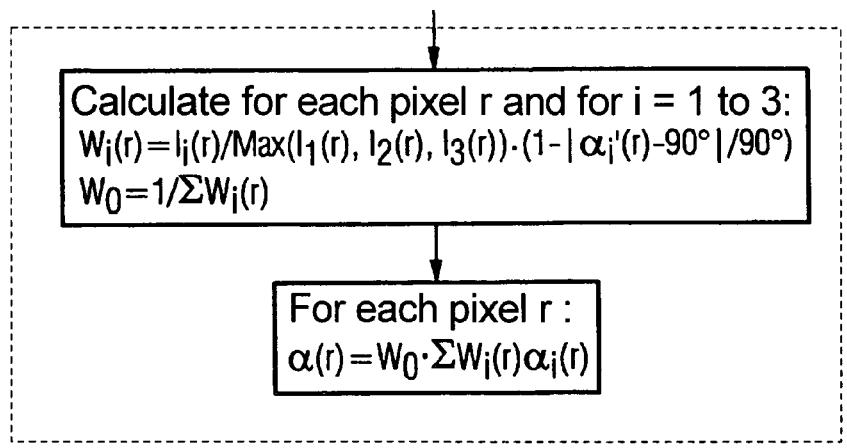
FIG. 7 is a detailed flowchart for a third variant of the last step in FIG. 4.

This method is represented in FIGS. 4 through 7 using flow charts, whereby FIG. 4 essentially describes the measuring operation and FIGS. 5 through 7 show different possibilities for the combining of a B$_1$ map from the different B$_1$ maps measured for the same slice.

First, in a measurement according to FIG. 4 in a first procedural step an estimated value of U$_0$ is determined for the HF pulse voltage, with which in the considered volume with a defined high frequency pulse a mean target flip angle $α_{target}$ of about 90° is to be achieved. In a second procedural step then the voltage U of the high frequency pulse of the measuring frequency is calculated with a target flip angle α on the basis of the estimated value U$_0$, whereby in the simplest case a value of 90° can also be selected for α. Since the measuring sequence works with several HF pulses, which can have different pulse amplitudes, in the process the voltage or the target flip angle is appropriately set individually for each pulse.

Next in a loop, which includes several procedural steps, multiple measurements are carded out with different measurement flip angles. The control variable in the representation in FIG. 4 is the variable i, which is first set to 1 before the start of the loop and which runs from 1 to $i_{max}$, for example in the case of three measurements until $i_{max}$=3.

First, within the loop in a first procedural step the voltage U is scaled with a predefined scale factor of SF$_i$, i.e. the current voltage to be used in this measurement U$_i$=SF$_i$· U is calculated. Since the flip angle is linearly dependent on the used pulse voltage, consequently the current measurement flip angle is $α_1'$=SF$_i$·α. The factor SF$_i$ changes with each pass. For example in the case of a triple measurement first a measurement with a factor of SF$_i$=0.5 could occur, i.e. the measurement takes place with half pulse voltage. The measurement flip angle of the first measurement accordingly equals 0.5·α. Then for example a measurement is performed in which the measurement flip angle $α_i'$ corresponds to the target flip angle α=90°. For this purpose a scale factor of 1.0 is selected. Then a third measurement is performed with a scale factor of $SF_i=1.5$. Accordingly then $\alpha_i'=1.5\cdot\alpha$ applies for the measurement flip angle. In the process preferably all flip angles of the measurement, however at least those of the refocusing pulses, are scaled with the selected factor.

In the following step the measurement of the $B_1$ map with the relevant pulse voltage $U_i$ takes place whereby the actual flip angle $a_i'(r)$ on location r is measured with an intensity $I_i(r)$. In the next procedural step this $B_1$ map is then scaled back to the original high frequency pulse voltage U, with which the target flip angle $\alpha$ would be achieved, i.e. the measured flip angles are standardized to the target flip angle $\alpha$. This takes place by means of a conversion of the values according to the equation $\alpha_i(r)=\alpha_i'(r)\cdot 1.0/SF_i$.

At the end of the loop a query of the control variable i takes place, to clarify whether the maximum number of measurements has already been performed. If this is not the case, in the next procedural step the control variable i is incremented by 1 and the next measurement is performed.

In the contrary case in the following procedural step the $B_1$ maps, which contain for each location or pixel r the corresponding flip angle $\alpha_i(r)$, are combined into one common $B_1$ map, which at a specified pixel r contains a specified flip angle $\alpha(r)$ generated on the basis of the individual $\alpha_i(r)$.

One deciding criterion is the fact that $\alpha_i'(r)$, i.e. the actually measured flip angle at the location in question, is as close as possible to 90° and that moreover for the relevant measurement a sufficient signal intensity of $I_i(r)$ was present. The criteria are selected in this manner because in the case of flip angles near 90° the influence of the relaxation time $T_1$ is in principle quite low and these flip angles consequently can be determined with especially great precision. Since different measurement flip angles are used in the images, those regions in which the actual achieved actual flip angles are close to 90° are naturally located in a different place in each of the images.

By means of combining $B_1$ maps thus measured with different measurement flip angles it is therefore possible to ensure that at each pixel the best measurement value with the lowest $T_1$ influence is used. That is, e.g. from three $B_1$ maps in which in specific (but different) areas the readings are falsified by the relaxation time $T_1$, one common $B_1$ map is generated that is to a great extent independent of the $T_1$ influence.

FIG. 5 shows one possibility of this pixel by pixel combination. In FIG. 5 for simplicity only three different measurements are assumed. The procedure can however also be performed with only two measurements or be extended to a random number of measurements.

In the method represented in FIG. 5 it is first determined for each individual location or pixel r whether the actual flip angle measured in the first measurement $\alpha_1'(r)$ is closer to 90° than the actual flip angle $\alpha_2'(r)$ measured in the second measurement and the actual flip angle $\alpha_3'(r)$ measured in the third measurement. In addition, the method also checks whether the intensity $I_i(r)$ measured in this location in the first measurement is sufficient. In this case the correspondingly standardized flip angle $\alpha_1(r)$ is transferred as the actual flip angle $\alpha(r)$ located in this location to the combined $B_1$ map. If this is not the case, the method checks whether the flip angle measured in the second measurement of $\alpha_2'(r)$ is smaller than the flip angle of $\alpha_3'(r)$ measured in the third measurement and whether the intensity measured in the second measurement of $I_2(r)$ is sufficient. If this is the case the correspondingly standardized flip angle of $\alpha_2(r)$ is used as the flip angle of $\alpha(r)$ that is actually present in the relevant location r. Otherwise the correspondingly standardized value of $\alpha_3(r)$ is transferred from the third measurement.

Figure 8:
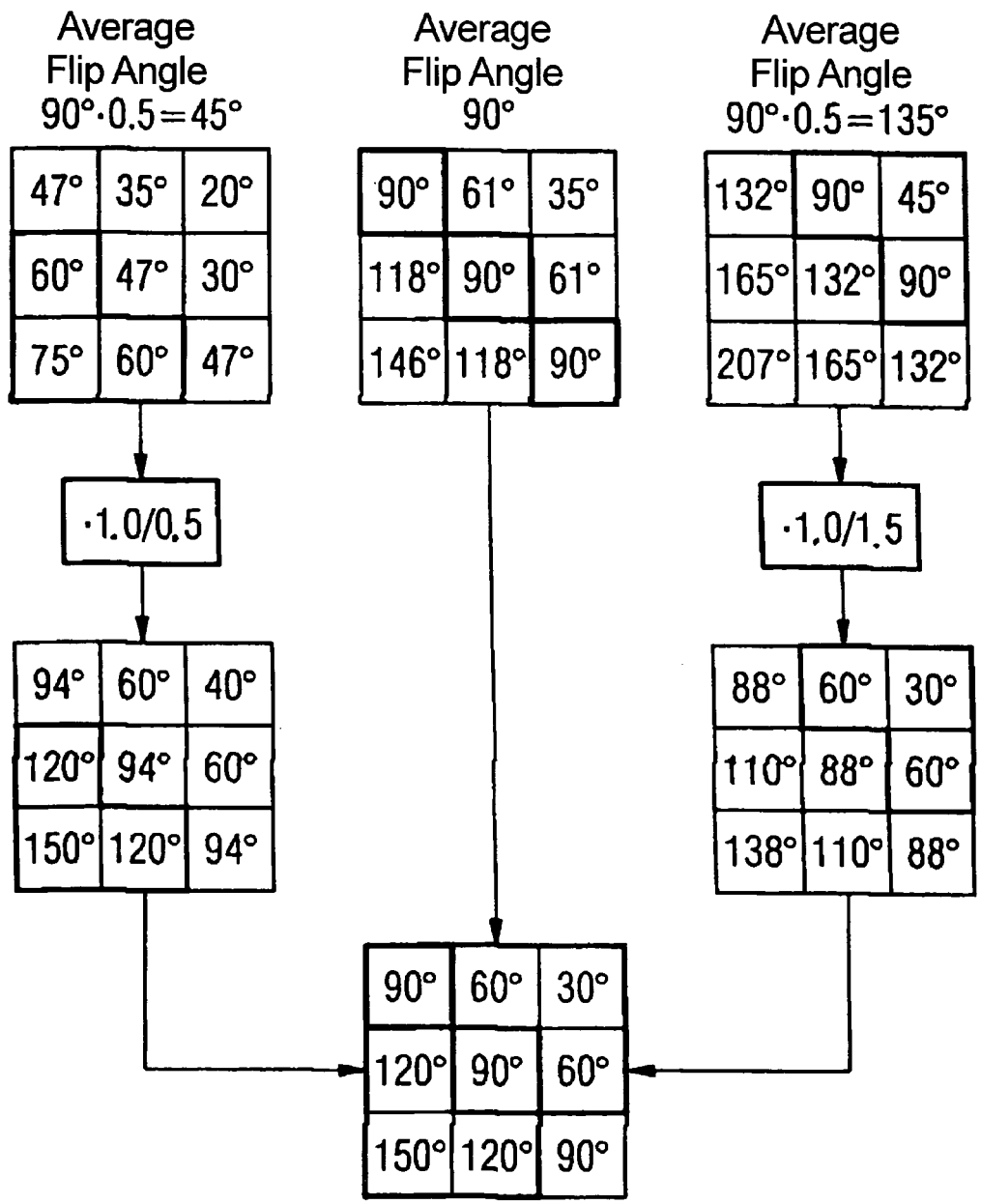
FIG. 8 schematically illustrates the combination of three measured spatially resolved flip angle distributions in a combined distribution according to the variant of FIGS. 4 and 5.

This method is also schematically represented again in FIG. 8. Each of the fields in the upper row of FIG. 8 represents a measurement of 3×3 pixels in a layer.

The target flip angle a amounts to 90°. The measurement performed with the corresponding voltage U is represented in the middle column.

In addition, a measurement is shown in which the scale factor $SF_1=0.5$ and the measurement flip angle consequently equals $\alpha_1'=0.5\cdot 90°$, i.e. 45°. This measurement is shown in the left column. In the third measurement the scale factor is $SF_3=1.5$ and the measurement flip angle is $\alpha_3'=135°$ (right column).

The original measurements are shown in the top row. Those areas that later go into the combined $B_1$ map are all marked in bold lines.

After the measurements the measured $B_1$ maps are rescaled in accordance with the previously selected scale factor. That is, all the measured values of the first measurement are scaled with a factor of 1.0/0.5. As a result of this the $B_1$ map represented in the second row of the left column is generated. In the same way the third measurement with the measurement flip angle of 135° is resealed with a scale factor of 1.0/1.5. As a result of this the map shown in the right column in the second row is generated. Since the second measurement was generated with the target flip angle predefined here of 90°, there is no need for a resealing. A selection of a target flip angle of 90° and the performing of a measurement with a measurement flip angle corresponding to the target flip angle is advisable for simplicity, but is not absolutely necessary.

Using the method shown in FIG. 5 all three maps, as represented in FIG. 8, are combined, so that finally the global card shown at the bottom in FIG. 8 is generated, in which the influence of the relaxation time $T_1$ is relatively slight.

FIG. 6 shows an alternative method for combination of the $B_1$ maps. For simplicity here again it is assumed that three measurements were performed. However, this method can also be performed with only two measurements or with a greater number of measurements. In the process, first a weight value $W_i(r)$ is calculated for each pixel r and for all measurements. For one thing, the deviation of the measured actual flip angle of $\alpha_i'(r)$ from a 90° flip angle enters into this weight value $W_i(r)$. For another, in this weight value $W_i(r)$ a standardized intensity $I_i(r)$ of the picked up signal in the measurement of the relevant actual flip angle of $\alpha_i'(r)$ is taken into consideration. The precise calculation of weight value $W_i(r)$ takes place in accordance with the following $$W_1(r) = \frac{I_i(r)}{\text{Max}(I_1(r), I_2(r), I_3(r))} \cdot \left(1 - \frac{|\alpha_i'(r) - 90|°}{90°}\right) \quad (7)$$

The weighting of the intensity occurs on the maximum value of all intensities (Ii(r), I2(r), I3(r)) measured in the same location in the various measurements.

For simplicity the amplitude of the spin echo image is assumed for $I_i(r)$.

In the subsequent steps the method then checks whether the weight value W1(r) from the first measurement at location r is greater than the weight value W2(r) from the second measurement and than the weight value W3(r) from the third measurement at the same location. If this proves to be the case, the $\alpha_1(r)$ flip angle measured and standardized at this location from the first measurement is used as the flip angle α(r) for the combined $B_1$ map. If this is not the case, the method then checks whether the W2(r) weight value at location r from the second measurement is greater than the W3(r) weight value from the third measurement. If this is the case the standardized flip angle of α2(r) is taken from the second measurement, otherwise the standardized flip angle of α3(r) is used from the third measurement.

FIG. 7 shows an additional alternative (once again, for simplicity's sake with three measurements), in which a mean flip angle α(r) is determined for each location in the following manner:

$$\alpha(r) = W_0 \cdot \sum W_1(r) \alpha_i(r) \quad (8)$$

$$W_0 = \frac{1}{\sum W_1(r)} \quad (9)$$

The weight value $W_i(r)$ is calculated here again according to Equation 7. With this method all flip angles $\alpha_i(r)$ measured and standardized in the various measurements go into the common $B_1$ card with corresponding weighting.

Figure 9:
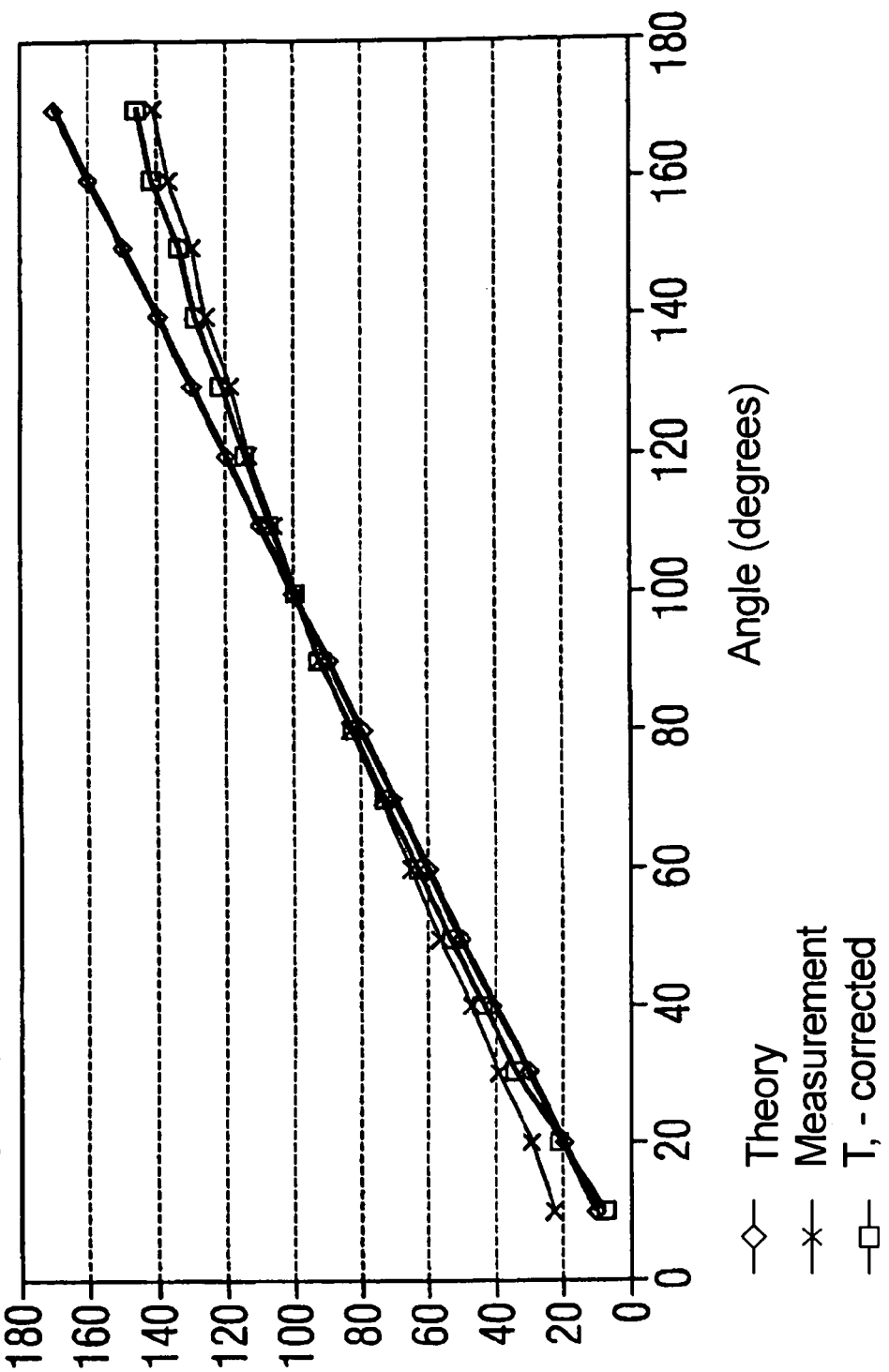
FIG. 9 shows a flip angle of the invention as a function of the corrected flip angle in comparison with a theoretical ideal value.

To prove that the method is able to correctly determine an actually set actual flip angle, first an oil phantom, in which high frequency penetration effects are negligible and in which thus a constant $B_1$ field in the object can be assumed, was imaged with different target flip angles. FIG. 9 shows the measured flip angles as a function of the set target flip angle. The straight, continuous line shows the theoretical values. The values marked with an asterisk are the measured values without any correction with regard to the $T_1$ relaxation. The values displayed in boxes are the same measured values, however after a simple $T_1$ relaxation correction with a constant factor of 1.07. Such a simple $T_1$ correction is possible without much trouble here, since the entire phantom consists of the same material. The graphic in FIG. 9 shows clearly that in the interval of 0 to 140° a very good match between the theory and the experimental measurements is achieved with the new method. Hence the method is also well suited for locally resolved, two-dimensional measurement of $B_1$ field distribution.

Figure 10:
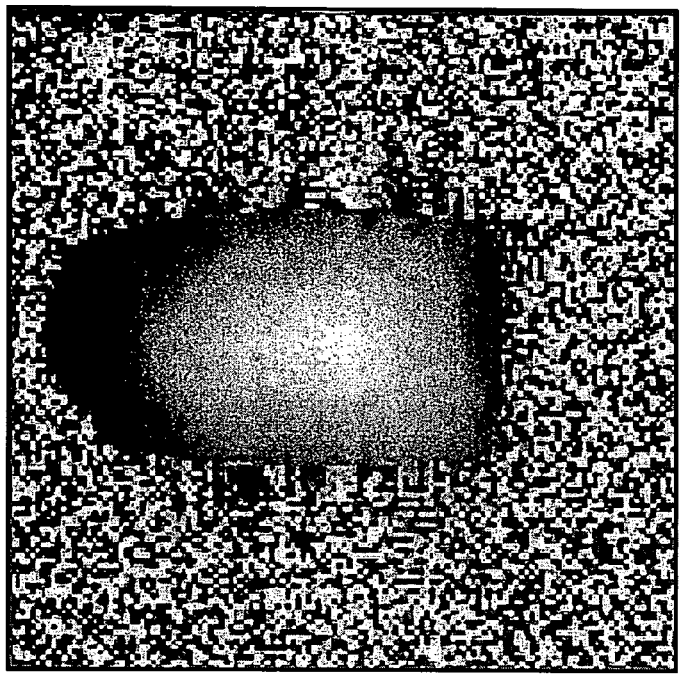
FIG. 10 shows a $B_1$ field distribution of a phantom bottle in sagittal section obtained using of the method of the invention.
Figure 11:
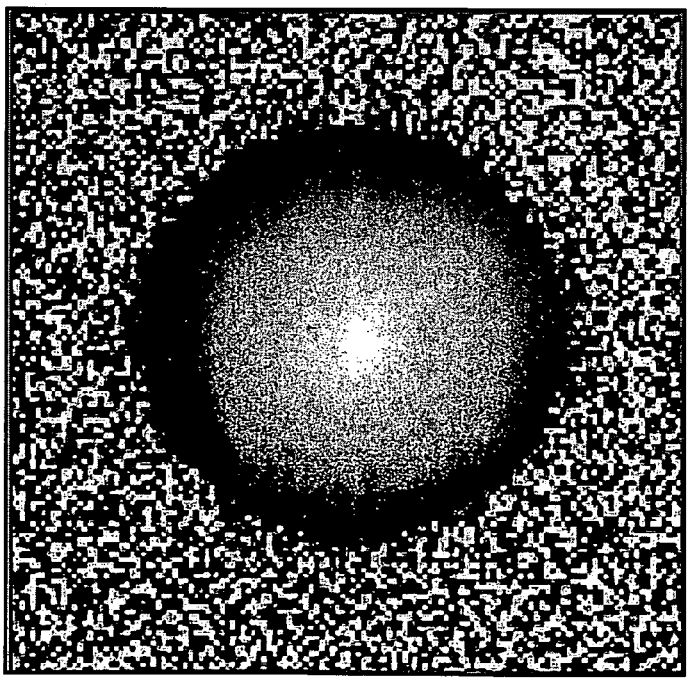
FIG. 11 shows a $B_1$ field distribution of a phantom bottle in transversal section obtained using the method of the invention.

FIGS. 10 and 11 show a $B_1$ distribution measured at a base field strength of 3 tesla in a water phantom. The data acquisition time in each case was about 45 s. FIG. 10 shows a sagittal section and FIG. 11 shows a transverse section.

Figure 12:
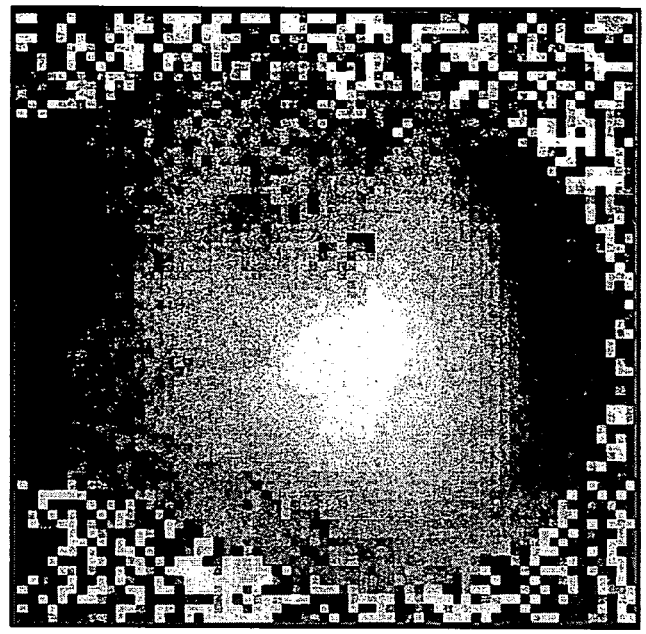
FIG. 12 shows a $B_1$ field distribution in the head of a probe in sagittal section obtained using the method of the invention.
Figure 13:
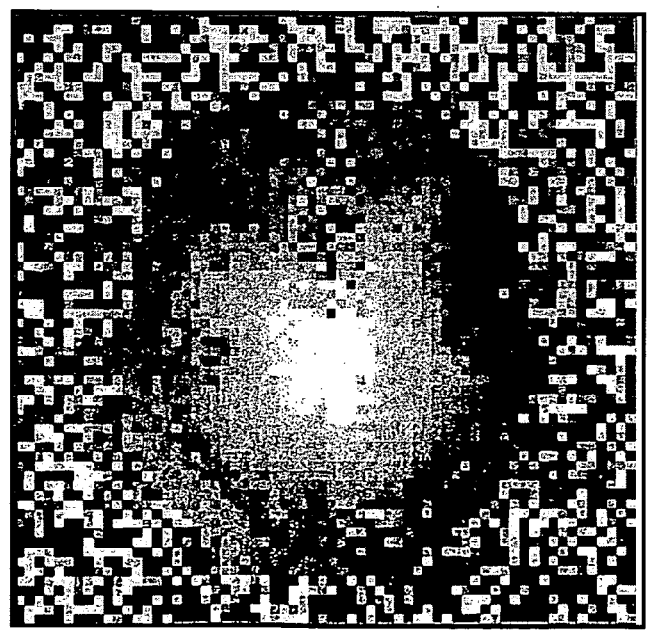
FIG. 13 shows a $B_1$ field distribution in the head of a probe in transverse section obtained using the method of the invention.

FIGS. 12 and 13 show a $B_1$ distribution of the head of a probe measured in vivo with the same base field strength of 3 tesla. The data acquisition time in each case was 15 s. FIG. 12 shows a sagittal section and FIG. 13 shows a transversal section. These measurements also show very clearly that the method is well suited for spatially resolved measurement of a $B_1$ distribution.

FIG. 14 shows a simple basic block diagram of an embodiment of a magnetic resonance tomography apparatus 1, with which the method of the invention can be performed.

The magnetic resonance tomography apparatus 1 includes a scanner 2, in which a patient O is positioned on a bed in an annular basic field magnet 13. Within the basic field magnet 13 a high frequency antenna 12 is located for the emission of the MR high frequency pulses. The scanner 2 is a commercially available unit that does not have to fulfill any special extra requirements for the method of the invention.

The scanner 2 is controlled by a controller 3, shown separately. A terminal (console) 4 as well as a mass memory 5 is connected to the controller 3. The terminal 4 serves as a user interface, from which a user operates the controller 3 and thus the scanner 2. The mass memory 5 is used to store acquired data representing images. The terminal 4 and the memory 5 are connected to the controller via an interface 6. The controller 3 is in turn connected to the tomograph 2 via interfaces 11, 10. The controller 3 and the terminal 4 and the memory 5 can be integral components of the scanner 2.

The entire magnetic resonance tomography apparatus 1 in addition exhibits all usual peripheral components or features such as e.g. interfaces for connection to a communication network, for example an image information system (picture archiving and communication system, PACS). For better clarity these components are not represented in FIG. 14.

The user can communicate with a sequence control unit 7 via the terminal 4 and the interface 6. The sequence control unit 7 controls the scanner 2 via the interface 11 and for example effects an emission of the desired high frequency pulse sequences through the antenna 12 and switches the gradients in suitable manner, in order to perform the desired data acquisition.

The measurement data from the scanner 2 are acquired via the interface 10 and combined in a signal evaluation unit 9 into images, which then for example are displayed on the terminal 4 and/or entered in the memory 5 via the interface 6.

The magnetic resonance tomography apparatus 1 include a field distribution measuring unit 8 here as part of the controller 3. This field distribution measuring unit 8, after a corresponding command by the terminal 4 and/or fully automatically within an examination program running in the sequence control unit 7, emits the required double echo high frequency pulse sequence for measurement of the $B_1$ field via the antenna 12 according to the method of the invention and appropriately switches the gradients. The magnetic resonance signals measured in the process are passed from the signal evaluation unit 9 to the field distribution measuring unit 8, which in accordance with the previously described method evaluates the data and by picking up several two dimensional layers reproduces a "three-dimensional" image for the distribution of the field strength $B_1$ or the flip angle within the measurement volume, e.g. here within a part of the patient O. These data can then be passed to the sequence control unit 7 so that the determined values can be taken into consideration in further measurements. For example the sequence control unit 7 can then calculated a suitable excitation profile on the basis of the measured distribution and emit it in a subsequent measurement. These data also can be output on terminal 4 or entered in the memory 5.

Generally, the field distribution measuring unit 8, the signal evaluation unit 9 and the sequence control unit 7 are implemented in the form of software modules of a processor of the controller 3. The purely software implementation has the advantage that existing magnetic resonance tomography apparatus can also be upgraded by means of an appropriate software upgrade in order to be able to perform an in vivo measurement of the $B_1$ field strength distribution according to the method of the invention. It is also possible for the field distribution measuring unit 8 to be a "field distribution measuring module" consist of several components or subroutines. In the process these subroutines can also be used by other components of the controller 3, i.e. if necessary already existing subroutines of other program units can be accessed in order to keep the expense as low as possible in the implementation of the field distribution measuring module.

The method of the invention makes available a very quick method for both measuring the transmission profile of high frequency coils as well as for examining the high frequency penetration behavior in vivo. The method also functions reliably with relatively high base magnet fields in the use of target flip angles in the range of approximately 0° to 140°. Hence the method can be used both for the manufacturing process as well as for the quality control of transmission coils.

In addition it is outstandingly well suited for the optimization of the patient-dependent adjustment of the $B_1$ field in a defined spatial range within a probe. Preferably at the beginning of a measurement a non-resolving general transmitter adjustment—i.e. a $B_1$ basic adjustment in accordance with the initially described conventional method—is performed, in order to be able to set the mean excitation flip angle a priori.

Prior to the beginning of the measurement a three-dimensional $B_1$ data acquisition can additionally be performed using the method of the invention thus optimizing the used flip angle within a specified volume of interest.

The invention has been explained primarily in the context of use in a magnetic resonance tomography apparatus for medical purposes, but the invention is not limited to such applications; and also can be used for scientific and/or industrial applications.

Although modifications and changes may be suggested by those skilled in the art, it is the intention of the inventors to embody within the patent warranted hereon all changes and modifications as reasonably and properly come within the scope of their contribution to the art.

We claim:

1. A method for spatially resolved measurement of a radio-frequency field distribution associated with radio-frequency pulses emitted by a radio-frequency antenna of magnetic resonance imaging apparatus adapted to receive an examination object therein, comprising the steps of:

emitting a double echo radio-frequency pulse sequence including a first excitation pulse followed by at least two refocusing pulses, respectively for generating a first echo and a following second echo, at least the excitation pulse being slice selective for exciting nuclear spins, by giving said nuclear spins a flip angle, in a selected slice of the examination object, said first excitation pulse and said at least two refocusing pulses producing an electromagnetic field having a field strength;

in the slice defined by said slice selective excitation pulse, spatially encoding a first echo image, associated with said first echo, and a second echo image, associated with said second echo by activating respective gradient pulses for at least one of phase encoding and frequency encoding, said first and second echo images respectively having amplitudes at a plurality of locations in the first and second echo images; and from a relationship of said amplitudes of said first and second echo images at said plurality of locations, determining said flip angle, as a representation of said field strength, in the slice selected by said excitation pulse.

2. A method as claimed in claim 1 comprising emitting said refocusing pulses as non-slice selective pulses.

3. A method as claimed in claim 1 comprising, in said double echo radio-frequency pulse sequence, emitting a plurality of slice-selective excitation pulses in succession for respectively exciting nuclear spins in a plurality of slices in the examination object, with non-slice selective refocusing pulses following a last of said slice selective excitation pulses, for generating a first echo and a second echo in each of said slices.

4. A method as claimed in claim 1 wherein said amplitudes of said first and second echo images are subject to an influence of spin relaxation, and comprising the additional step of, prior to determining said flip angle, waiting the respective amplitudes at the respective locations with a correction factor for reducing said spin relaxation influence.

5. A method as claimed in claim 4 comprising selecting said correction factor dependent on the type of said nuclei being excited.

6. A method as claimed in claim 1 wherein said first and second echo images are each comprised of pixels and wherein said amplitudes in said first and second echo images are subject to an influence of spin relaxation, and comprising the additional steps, for reducing said spin relaxation influence, of:

for said selected slice, determining a flip angle distribution at said plurality of locations and multiply spatially resolving said flip angle distribution with respectively different target flip angles, to produce a plurality of flip angle distributions; and combining said plurality of flip angle distributions pixel-by-pixel with respect to said first and second echo images for determining a corrected flip angle distribution in said selected slice.

7. A method as claimed in claim 6 comprising, in the multiple spatially resolved measurements of said flip angle distribution, multiply acquiring data representing said first and second echoes only in rows of a central region of k-space, and acquiring data in remaining rows of k-space only once for all of said measurements.

8. A method as claimed in claim 6 comprising, in said plurality of flip angle distributions, identifying, at respective pixels having a sufficiently high intensity, a flip angle most closely approximating a 90° flip angle, and using said flip angle most closely approximating a 90° flip angle as a standard for producing said corrected flip angle distribution.

9. A method as claimed in claim 6 comprising forming an average value of said flip angle distributions for producing said corrected flip angle distribution.

10. A method as claimed in claim 1 comprising the additional step of adjusting the radio-frequency pulses in said radio-frequency pulse sequence dependent on the field strength represented by said flip angle, to generate an adjusted field strength with said adjusted radio-frequency pulses.

11. A method as claimed in claim 10 comprising determining a radio-frequency pulse excitation profile from said flip angles at said plurality of locations, for said radio-frequency pulse sequence, and when subsequently employing said radio-frequency pulse sequence, also employing said radio-frequency pulse excitation profile associated therewith.

12. A magnetic resonance tomography apparatus comprising:

a radio-frequency antenna;

a gradient system; and a control unit connected to said radio-frequency antenna and to said gradient system for operating said radio-frequency antenna to emit a double echo radio-frequency pulse sequence including a first excitation pulse followed by at least two refocusing pulses, respectively for generating a first echo and a following second echo, with at least the excitation pulse being slice selective for exciting nuclear spins, by giving said nuclear spins a flip angle, in a selected slice of the examination object, said first excitation pulse and said at least two refocusing pulses producing an electromagnetic field having a field strength, and for operating said gradient system to, in the slice defined by said slice selective excitation pulse, spatially encode a first echo image, associated with said first echo, and a second echo image, associated with said second echo by activating respective gradient pulses for at least one of phase encoding and frequency encoding, said first and second echo images respectively having amplitudes at a plurality of locations in the first and second echo images, and said control unit, from a relationship of said amplitudes of said first and second echo images at said plurality of locations, for determining said flip angle, as a representation of said field strength, in the slice selected by said excitation pulse.

13. A computer program product loadable into a control unit of a magnetic resonance tomography apparatus for causing said control unit to control said magnetic resonance tomography apparatus to:

emit a double echo radio-frequency pulse sequence including a first excitation pulse followed by at least two refocusing pulses, respectively for generating a first echo and a following second echo, at least the excitation pulse being slice selective for exciting nuclear spins, by giving said nuclear spins a flip angle, in a selected slice of the examination object, said first excitation pulse and said at least two refocusing pulses producing an electromagnetic field having a field strength;

in the slice defined by said slice selective excitation pulse, spatially encode a first echo image, associated with said first echo, and a second echo image, associated with said second echo by activating respective gradient pulses for at least one of phase encoding and frequency encoding, said first and second echo images respectively having amplitudes at a plurality of locations in the first and second echo images; and from a relationship of said amplitudes of said first and second echo images at said plurality of locations, determine said flip angle, as a representation of said field strength, in the slice selected by said excitation pulse.

* * * * *